US009931671B2

(12) United States Patent
Choi et al.

(10) Patent No.: US 9,931,671 B2
(45) Date of Patent: Apr. 3, 2018

(54) PIEZOELECTRIC VIBRATION ACTUATOR

(71) Applicant: SAMSUNG ELECTRO-MECHANICS CO., LTD., Suwon-si (KR)

(72) Inventors: Joon Choi, Suwon-si (KR); Kyung Su Park, Suwon-si (KR); Dong Su Moon, Suwon-si (KR); Yeon Ho Son, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 446 days.

(21) Appl. No.: 14/707,827

(22) Filed: May 8, 2015

(65) Prior Publication Data

US 2016/0101438 A1 Apr. 14, 2016

(30) Foreign Application Priority Data

Oct. 10, 2014 (KR) ........................ 10-2014-0136888

(51) Int. Cl.
*H01L 41/09* (2006.01)
*B06B 1/06* (2006.01)

(52) U.S. Cl.
CPC .................................. *B06B 1/0648* (2013.01)

(58) Field of Classification Search
CPC .................................................... B06B 1/0648
USPC ....... 310/311, 324, 328, 329, 339, 340, 344, 310/348
See application file for complete search history.

(56) References Cited

U.S. PATENT DOCUMENTS

| | | | | | |
|---|---|---|---|---|---|
| 3,538,232 | A * | 11/1970 | Knauert | G10H 3/146 | 310/329 |
| 4,972,713 | A * | 11/1990 | Iwata | B60R 25/1006 | 310/329 |
| 5,118,981 | A * | 6/1992 | Kobayashi | B60G 17/01941 | 310/324 |
| 7,919,907 | B2 * | 4/2011 | Reichenbach | B60C 23/0411 | 310/329 |

(Continued)

FOREIGN PATENT DOCUMENTS

| | | |
|---|---|---|
| KR | 10-2013-0125170 A | 11/2013 |
| KR | 10-2013-0125172 A | 11/2013 |

(Continued)

OTHER PUBLICATIONS

KIPO Office Action for Korean Patent Application No. 10-2014-0136888 which corresponds to the above-referenced U.S application.

*Primary Examiner* — Thomas Dougherty
(74) *Attorney, Agent, or Firm* — LRK Patent Law Firm

(57) ABSTRACT

There is provided a piezoelectric vibration actuator including: a flat cover member; a vibration portion including a vibration plate that is spaced apart from the cover member in parallel by a predetermined distance and a piezoelectric element that generates a vibration force by repeatedly expanding and contracting according to power applied from the outside; a weight portion disposed on the vibration portion to increase the vibration force of the piezoelectric element; and a binding member fixing the vibration portion and the weight portion.
In addition, an enclosure portion is interposed between the weight portion and the vibration portion to enclose the center areas of the vibration portion, thereby making it possible to protect the piezoelectric element.

16 Claims, 7 Drawing Sheets

(56) References Cited

U.S. PATENT DOCUMENTS

| | | | | |
|---|---|---|---|---|
| 8,058,774 | B2 * | 11/2011 | Fujimoto | H01L 41/1134 310/324 |
| 2008/0136292 | A1 * | 6/2008 | Thiesen | B60C 23/041 310/334 |
| 2012/0212100 | A1 * | 8/2012 | Lee | H01L 41/053 310/317 |
| 2013/0088123 | A1 * | 4/2013 | Haskett | H01L 41/1136 310/329 |
| 2013/0162415 | A1 * | 6/2013 | Kim | G06F 3/016 340/407.1 |
| 2014/0285064 | A1 * | 9/2014 | Kim | B06B 1/0644 310/317 |
| 2014/0333178 | A1 * | 11/2014 | Liu | H01L 41/053 310/323.01 |
| 2015/0364668 | A1 * | 12/2015 | Jung | H01L 41/0933 310/317 |
| 2017/0028441 | A1 * | 2/2017 | Kagayama | H01L 41/09 |

FOREIGN PATENT DOCUMENTS

| | | |
|---|---|---|
| KR | 10-2014-0072620 A | 6/2014 |
| KR | 10-2014-0078531 A | 6/2014 |
| KR | 10-2014-0085268 A | 7/2014 |

* cited by examiner

PIEZOELECTRIC VIBRATION ACTUATOR

CROSS-REFERENCE TO RELATED APPLICATION

This application claims the benefit of Korean Patent Application No. 10-2014-0136888, filed on Oct. 10, 2014, entitled "Piezoelectric Vibration Actuator" which is hereby incorporated by reference in its entirety into this application.

BACKGROUND

The present disclosure relates to a piezoelectric vibration actuator.

In general, a vibration function is used for various uses in portable electronic devices such as a mobile phone, an E-book terminal, a game player, or a portable multimedia player (PMP).

In particular, a vibration generating device for generating vibration is usually mounted in a portable electronic device and used as an alarm in the form of a soundless reception signal.

According to multi-functionality of portable electronic devices, not only a compact size but also integration and various high-functionality are required from a vibration generating device.

Recently, according to the demand of users to use a portable electronic device easily, a touch-type device in which information is input by touching the portable electronic device is generally selected, and a haptic module, which is a type of haptic interface, may also be applied so as to provide a user with an easier and more convenient communication with a computer or a program. "Haptic" which refers to tactile recognition contains not only the concept of inputting information by touching but also the concept of diversifying feedback to a touch by reflecting intuitive experience of a user, in an interface.

Patent document 1 disclosing a method of generating a vibration force using a piezoelectric element discloses that a lower plate and an upper plate are formed as an integral single component, and thus convenience in regard to assembly may be provided. However, if an impact is applied to a vibration plate in a length direction thereof due to unexpected dropping collision, stress may be concentrated on a bonding portion between the lower plate and the upper plate, and a weight body may not be maintained and held via the vibration plate due to damages such as cracks.

RELATED ART DOCUMENT

Patent Document (Patent Document 1) Korean Patent Laid-Open Publication No. KR 10-2013-0125170

SUMMARY

An aspect of the present disclosure may provide a piezoelectric vibration actuator in which a vibration portion including a piezoelectric element and a weight portion are assembled using a banding scheme so as to provide a degree of freedom to the vibration portion and the weight portion.

According to an aspect of the present disclosure, a piezoelectric vibration actuator may be provided, in which, by using a binding member formed of a banding member such as a tape or a ring-shaped band, a reliable binding state between a weight portion and a vibration portion may be secured even against not only vertical flexural vibration due to a vibration force but also traverse impact due to abnormal collision.

According to another aspect of the present disclosure, a piezoelectric vibration actuator may include: a flat cover member; a vibration portion including a vibration plate that is spaced apart from the cover member in parallel by a predetermined distance and a piezoelectric element that generates a vibration force by repeatedly expanding and contracting according to power applied from the outside; a weight portion disposed on the vibration portion to increase the vibration force of the piezoelectric element; and a binding member fixing the vibration portion and the weight portion.

According to another aspect of the present disclosure, an enclosure portion may be interposed between the weight portion and the vibration portion, and the weight portion, the vibration portion, and the enclosure portion are bound to each other using binding member formed of a banding member such as a tape or a ring-shaped band, thereby closely adhering and fixing them to each other.

According to another aspect of the present disclosure, the piezoelectric element disposed in a center area of the vibration portion may be protected by using the enclosure portion enclosing the center area of the vibration portion in the piezoelectric vibration actuator.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
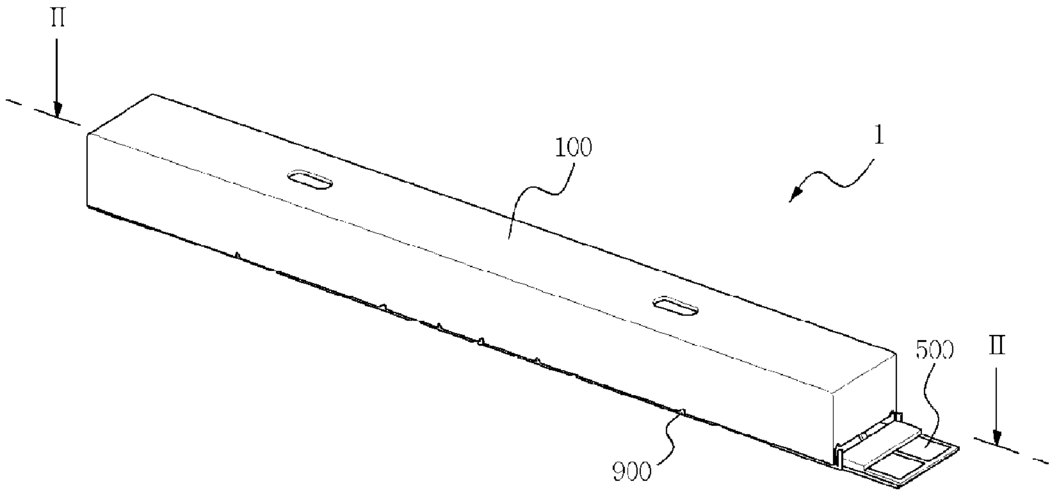
FIG. 1 is a perspective view of a piezoelectric vibration actuator according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

The present disclosure relates to a piezoelectric vibration actuator 1 which is capable of transmitting a vibration force of a piezoelectric element to external components via repeated contraction and expansion.

Figure 2:
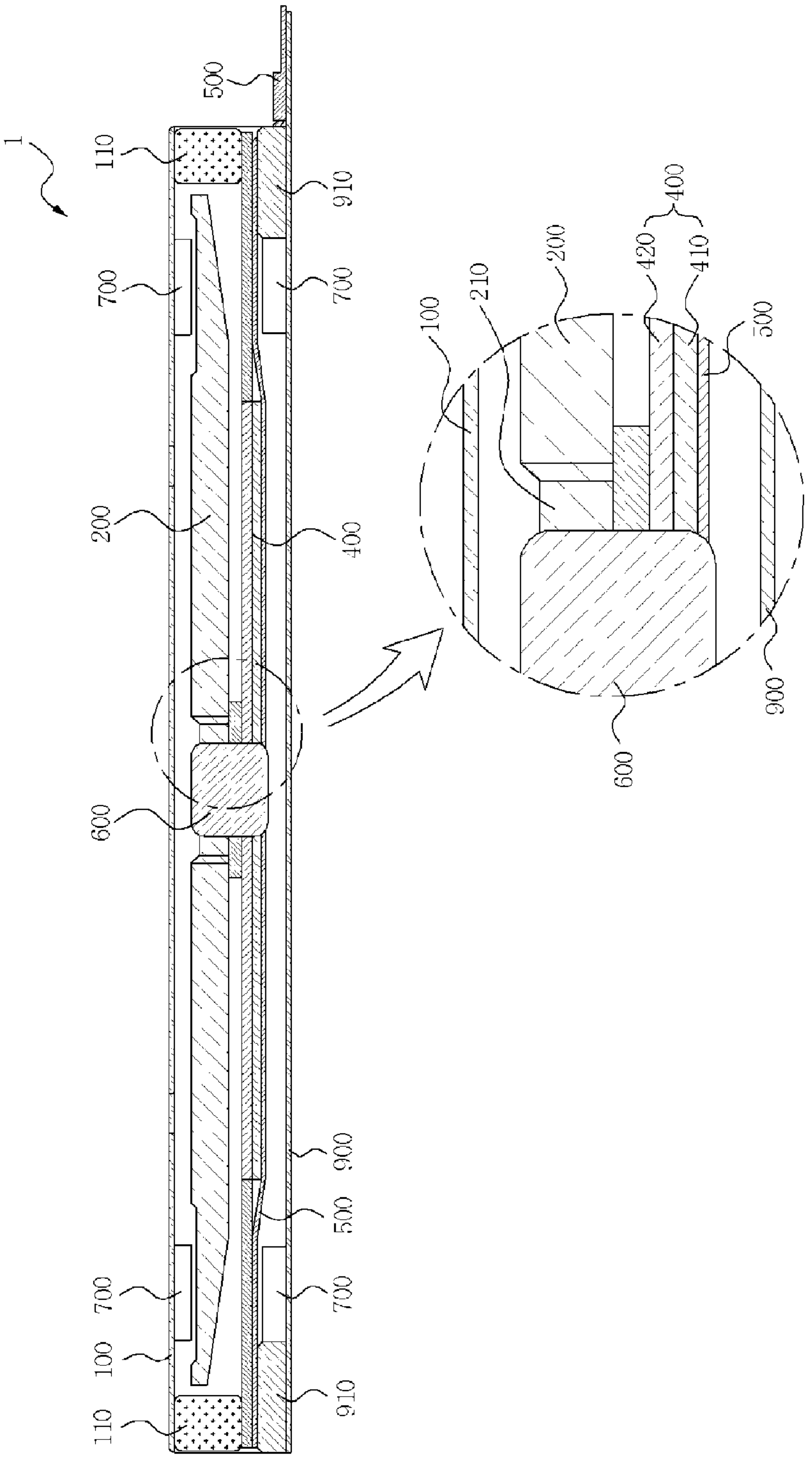
FIG. 2 is a cross-sectional view of a piezoelectric vibration actuator according to an exemplary embodiment of the present disclosure, cut along a line II-II of FIG. 1.
Figure 3:
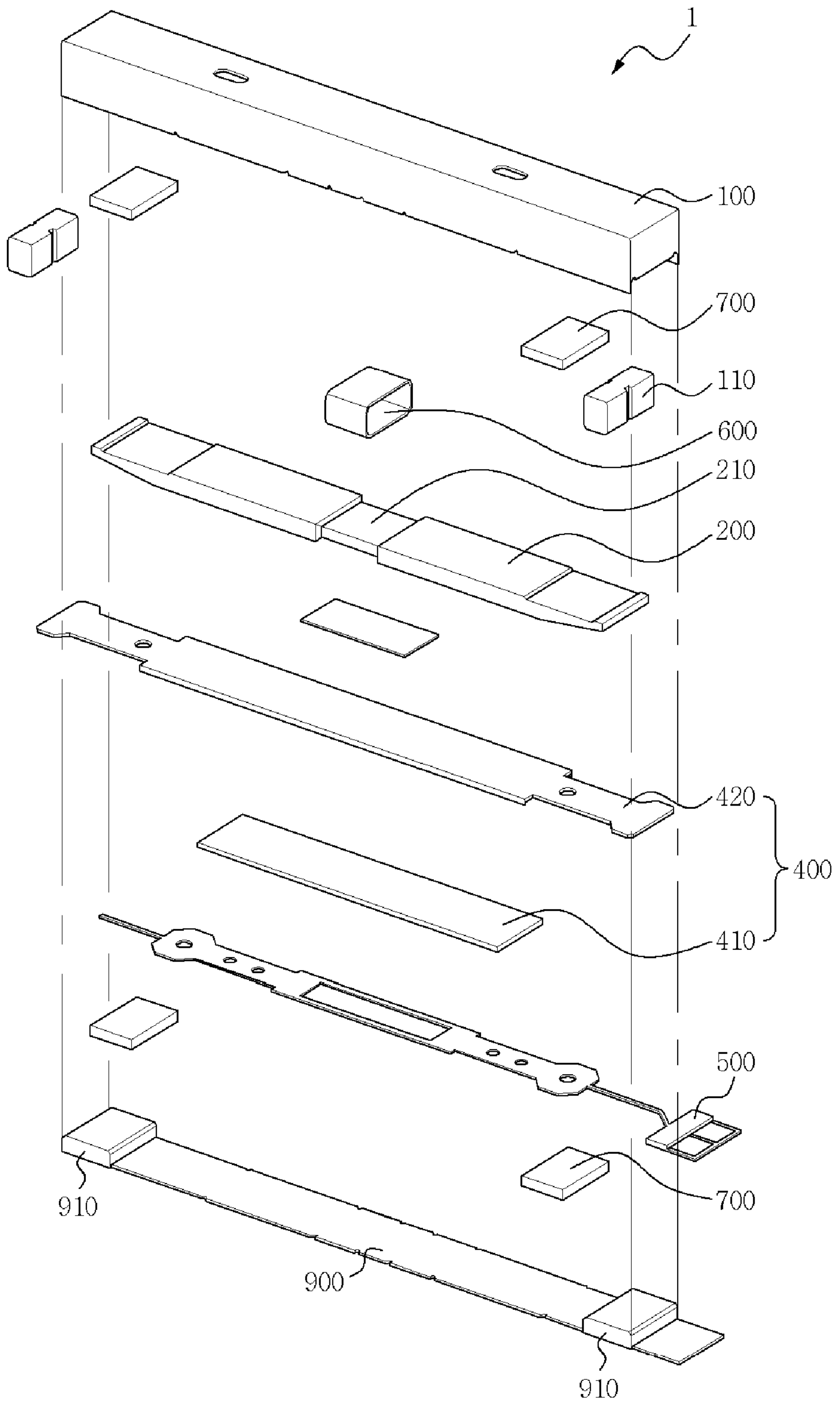
FIG. 3 is a schematic disassembled perspective view of a piezoelectric vibration actuator according to an exemplary embodiment of the present disclosure.
Figure 4:
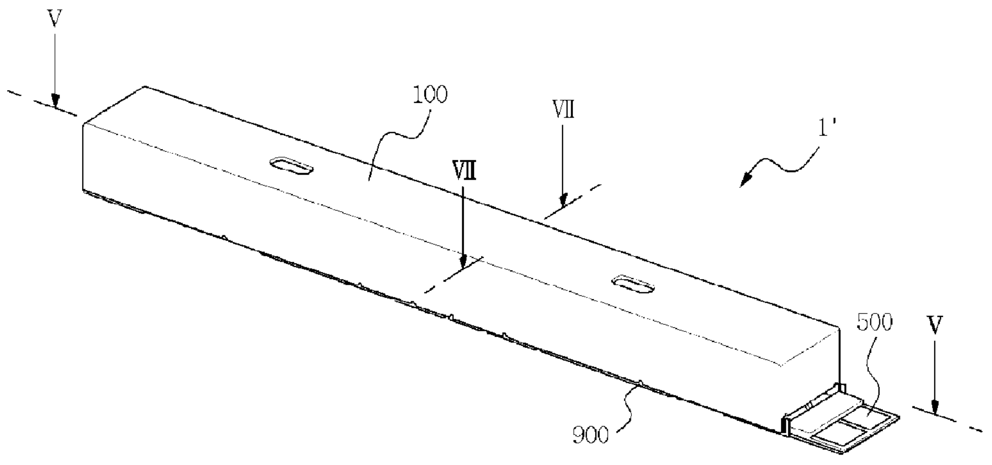
FIG. 4 is a perspective view of a piezoelectric vibration actuator according to another exemplary embodiment of the present disclosure.

Referring to FIGS. 1 through 3, the piezoelectric vibration actuator 1 according to an exemplary embodiment of the present disclosure is a device that generates a vibration force in, for example, a touch screen panel (not shown), and is surrounded by a case 100 and a cover member 900, and includes a vibration portion 400 that is linearly driven by flexurally vibrating in a vertical direction according to power applied to a flexible printed circuit board 500 or a printed circuit board. Also, the piezoelectric vibration actuator 1 according to an exemplary embodiment of the present disclosure includes a weight portion 200 in its inner space.

The case 100 may have a slim and long, rectangular box shape with one opened surface (for example, a lower surface), and may accommodate the vibration portion 400, that is, a piezoelectric element 410 and a vibration plate 420. As illustrated in FIGS. 1 through 3, the one opened surface of the case 100 of the piezoelectric vibration actuator 1 according to an exemplary embodiment of the present disclosure may be covered with the cover member 900 so as to close the inner space of the case 100. Here, the case 100 may also have other shapes than the illustrated rectangular box shape according to the shape and size of a vibration portion. Also, the cover member 900 has the size and shape that may close the one opened surface of the case 100.

The case 100 and the cover member 900 may be coupled to each other using various methods that are well-known to one of ordinary skill in the art, such as caulking, welding or bonding.

The piezoelectric vibration actuator 1 according to the present disclosure is driven using the vibration portion 400 that generates a vibration force in a vertical direction via translational motion of the piezoelectric element 410 that repeats expansion and contraction according power applied from the outside as described above.

As illustrated in FIGS. 2 and 3, the vibration portion 400 is formed of the piezoelectric element 410 and the vibration plate 420. The vibration portion 400 is electrically connected to the flexible printed circuit board 500 that applies power to drive the piezoelectric element 410. Here, for clear understanding of the present disclosure, description of wiring between the piezoelectric element 410 and the flexible printed circuit board 500 will be omitted.

When power is applied to the piezoelectric element 410 via the flexible printed circuit board 500, as the piezoelectric element 410 is completely attached to the vibration plate 420, moment is generated with respect to a center portion of the vibration plate 420 via expansion and/or contraction. As moment is generated in the vibration plate 420 while the vibration plate 420 is fixed to an inner surface of the case 100 of the piezoelectric vibration actuator 1 facing the vibration plate 420, the center portion of the vibration plate 420 is flexurally deformed in the vertical direction. In order to prevent direct collision between the piezoelectric element 410 and the cover member 900 due to displacement of the vibration plate 420 in the vertical direction, the vibration plate 420 may preferably be spaced apart upwardly from the cover member 900 by a predetermined distance (in consideration of displacement of the vibration plate 420). As is well-known to one of ordinary skill in the art, the piezoelectric element 410 may be formed of various materials such as polymer or ceramic.

As described above, the vibration plate 420 is repeatedly expanded or contracted as a single body with the piezoelectric element 410 disposed on the lower surface of the vibration plate 420 so as to transmit a vibration force of the piezoelectric element 410 to external components. The vibration plate 420 is generally in the form of a flat plate. The piezoelectric element 410 is mounted on one flat surface of the vibration plate 420, specifically, on the lower surface thereof, and the weight portion 200 is disposed on the other surface of the vibration plate 420, specifically, on an upper surface thereof.

The vibration plate 420 may be formed of a metal material having elasticity, such as steel use stainless (SUS), so that the vibration plate 420 may be deformed integrally with the piezoelectric element 410 which repeats expansion and contraction according to power applied from the outside via the flexible printed circuit board 500. Also, if the vibration plate 420 and the piezoelectric element 410 are bonded to each other using a bonding method, the vibration plate 420 may be formed of Invar which is a material having a similar coefficient of thermal expansion as that of the piezoelectric element 410 in order to prevent bending that may be caused due to hardening of an adhesive material. As described above, the vibration plate 420 is formed of an Invar material having a similar coefficient of thermal expansion as that of the piezoelectric element 410, and thus, thermal stress in the piezoelectric element 410 which is generated due to an operation or thermal impact under a high-temperature external environment may be reduced, thereby preventing piezoelectric deterioration whereby electrical characteristics are degraded.

Figure 6:
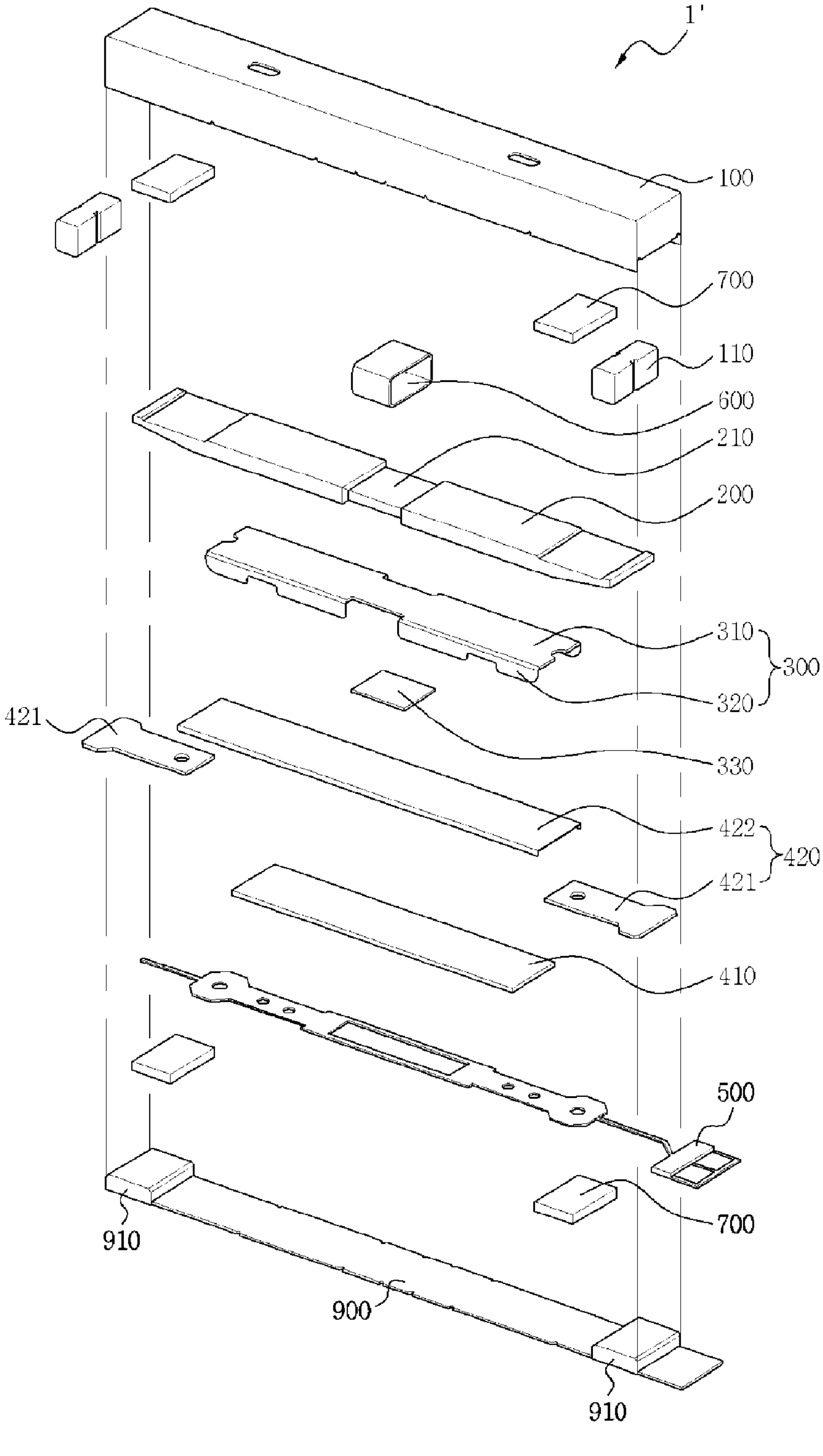
FIG. 6 is a schematic disassembled perspective view of a piezoelectric vibration actuator according to another exemplary embodiment of the present disclosure.

In addition, the vibration plate 420 may also be formed of a pair of first plates spaced apart from each other and a second plate that connects the pair of first plates, as illustrated in FIG. 6.

As illustrated in FIGS. 2 and 3, the vibration plate 420 of the vibration portion 400 is spaced apart from the cover member 900 in parallel by a predetermined distance, and preferably, mounting portions 910 are formed at two ends portions of the cover member 900. The mounting portions 910 may provide space between the vibration plate 420 and the cover member 900.

The case 100 includes blocks 110 each disposed on inner surfaces thereof facing each other, for example, on inner surfaces of a left side wall and a right side wall, so as to correspond to the mounting portions 910. As illustrated in FIG. 2, the blocks 110 protrude from the inner surfaces of the case 100 toward a center portion at the same height as the weight portion 200 which is to be disposed in the inner space formed by the case 100 and the cover member 900. In addition, the blocks 110 downwardly press two end portions of the vibration plate 420 arranged on the mounting portions 910. Accordingly, the vibration plate 420 may be firmly fixed, thereby maximizing moment and enabling reliable flexural vibration.

Here, the two blocks 110 may preferably be spaced apart from each other by a greater distance than a length portion of the weight portion 200 so that reciprocal motion of the weight portion 200 in a vertical direction is not disturbed.

The blocks 110 may prevent damage to the piezoelectric element 410 by using contact between the two end portions of the weight portion 200 and the inner surface of the case 100 if an external impact is applied to the piezoelectric vibration actuator 1 according to the present disclosure, particularly, if a lengthwise impact (traverse direction) is applied to the piezoelectric vibration actuator 1. If a traverse impact is applied, the weight portion 200 may reduce an amount of lengthwise movement of the piezoelectric vibration actuator 1 by using the blocks 110, thereby protecting the piezoelectric element 410 and also improving drop reliability at the same time.

Selectively, the blocks 110 may be formed of the same material as the case 100, and of a rigid material which has a high modulus of elasticity and is thus hardly elastically deformed. The blocks 110 are not limited thereto, and may also be formed of a soft material such as a damper in order to mitigate impact.

The vibration portion 400 includes the weight portion 200 on the vibration plate 420 as described above, and the weight portion 200 is fixed to the vibration plate 420 by using a binding member 600. The binding member 600 binds the weight portion 200 and the center portion of the vibration plate 420 with each other so that they are adhered to each other. According to necessity, a two-sided tape may be interposed between the vibration plate 420 and the weight portion 200 to facilitate fixation thereof.

Here, the weight portion 200 may have a bar shape as illustrated in FIG. 3 and as a medium that maximizes a vibration force of the vibration portion 400. Also, the weight portion 200 is upwardly inclined from the center portion of the weight portion 200 to the two end portions thereof in order to prevent contact with the vibration plate 420 when the weight portion 200 is flexurally vibrated. In addition, in the piezoelectric vibration actuator 1 according to the present disclosure, the case 100 is spaced apart from an upper portion of the weight portion 200 by a predetermined distance so that the weight portion 200 does not contact or collide with the upper inner surface of the case 100 unnecessarily even when the vibration plate 420 of the vibration portion 400 is being driven to be displaced and bent upwardly.

For reference, the weight portion 200 may be formed of a metal material, and preferably, of a tungsten which has a relatively high density per a unit volume.

Selectively, a concave portion 210 is formed in an outer circumferential surface of a center area of the weight portion 200. The concave portion 210 may have a form that receives the binding member 600 so that a coupling position of the binding member 600 may be confirmed, and moreover, traverse movement of the binding member 600 may be restricted using the concave portion 210.

The binding member 600 couples the center area of the weight portion 200 and a center area of the vibration portion 400 as illustrated in FIGS. 2 and 3, and a banding member such as a tape is used as the binding member 600. Selectively, the binding member 600 may be formed of an elastic soft material to continuously tighten the weight portion 200 and the vibration portion 400 so that clearance does not occur even during flexural vibration. Thus, the binding member 600 may be formed of a contractible soft material.

In addition, the binding member 600 may be in the form of a ring-shaped band as illustrated in FIG. 3.

The binding member 600 does not fix the weight portion 200 and the vibration plate 420 of the vibration portion 400 using a conventional fixing method such as a fixing method using a bracket or a fixing method by using a bonding method, and thus minimizes a stress in a bonding portion between the weight portion 200 and the vibration portion 400 in a case of dropping collision or traverse impact and secures reliable binding of the weight portion 200 and the vibration portion 400. In addition, the binding member 600 is mounted by enclosing the weight portion 200 and the vibration portion 400 in the form of a ring-shaped band or a tape, and thus convenience in terms of assembly is additionally provided.

In other words, the piezoelectric vibration actuator 1 according to an exemplary embodiment of the present disclosure has a structure, in which fixation of the weight portion 200 and the vibration portion 400 is facilitated via a tension operation of the binding member 600, and also, as the two components are not fixed as a single body, if external impact is applied, flexibility is provided to the bonding portion and an external force applied to one component is not transmitted to the other component.

In addition, the piezoelectric element 410 may be a single-layered structure or stacked in a multi-layered structure. Piezoelectric elements stacked in a multi-layered structure may secure an electrical field required to drive the piezoelectric elements even at a low external voltage. This may provide the effect of reducing a driving voltage of the piezoelectric vibration actuator according to the present disclosure, and thus, the piezoelectric elements stacked in a multi-layered structure may be preferably used in the present disclosure.

In the piezoelectric vibration actuator 1 according to an exemplary embodiment of the present disclosure, an impact buffer member 700 capable of protecting the weight portion 200 or the vibration portion 400 without affecting a vibration force generated by activation of the piezoelectric element 410 is formed on an upper inner surface of the case 100 and an upper surface of the cover member 900. Selectively, the impact buffer member 700 may be formed of a poron material reducing vibration and noise when the vibration portion 400, the weight portion 200, the case 100, or the cover member 900 contact one another.

FIGS. 4 through 7 are schematic views illustrating a piezoelectric vibration actuator 1' according to another exemplary embodiments of the present disclosure.

In detail, the piezoelectric vibration actuator 1' according to another exemplary embodiment of the present disclosure has a very similar structure to that of the piezoelectric vibration actuator 1 illustrated in FIGS. 1 through 3 except for an arrangement of the weight portion 200 and the vibration portion 400, and thus, for clear understanding of the present closure, description of similar or identical components will be omitted.

The piezoelectric vibration actuator 1' according to another exemplary embodiment of the present disclosure is formed of the case 100 having one opened surface, the cover member 900 that closes the one opened surface, the vibration portion 400 that linearly drives due to expansion and/or contraction of the piezoelectric element 410 in inner space defined by the case 100 and the cover member 900, the weight portion 200 disposed on the vibration portion 400, the binding member 600 that binds the vibration portion 400 and the weight portion 200 at circumferences of the vibration portion 400 and the weight portion 200, and an enclosure portion 300 interposed between the vibration portion 400 and the weight portion 200.

Figure 5:
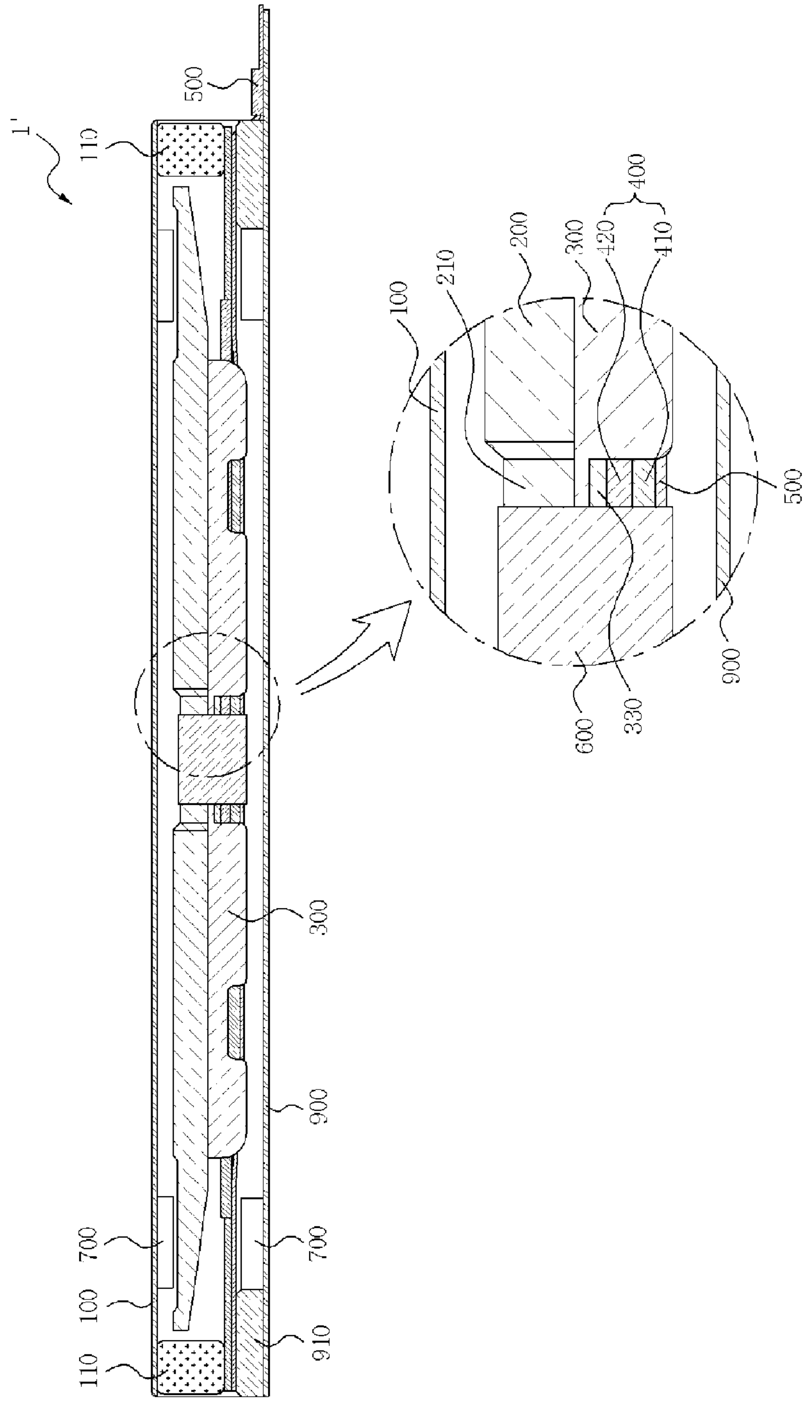
FIG. 5 is a cross-sectional view illustrating a piezoelectric vibration actuator according to another exemplary embodiment of the present disclosure, cut along a line V-V of FIG. 4.
Figure 7:
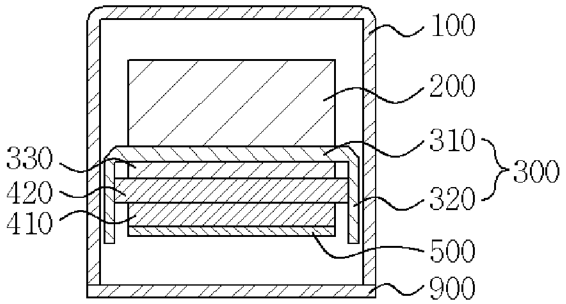
FIG. 7 is a cross-sectional view illustrating a piezoelectric vibration actuator according to another exemplary embodiment of the present disclosure, cut along a line VII-VII of FIG. 4.

In particular, in the piezoelectric vibration actuator 1' according to another exemplary embodiment of the present disclosure, the enclosure portion 300 is disposed between the weight portion 200 and the vibration portion 400 as illustrated in FIGS. 5 through 7 to enclose the center area of the vibration portion 400.

The enclosure portion 300 is a component having a reverse U-shaped cross-section as illustrated in FIGS. 6 and 7, and includes a leg portion 320 that extends vertically downward from two edges of a flat surface 310. The leg portion 320 of the enclosure portion 300 extends by a greater size than a sum of thicknesses of the piezoelectric element 410 and the vibration plate 420. When the vibration portion 400 flexurally vibrates in a vertical direction, the leg portion 320 performs the function as a stopper that restricts downward displacement of the vibration plate 420, and thus may prevent direct collision between the piezoelectric element 410 disposed under the vibration plate 420 and the cover member 900.

The flat surface 310 of the enclosure portion 300 allows the lower surface of the weight portion 200 and an upper surface of the vibration plate 420 of the vibration portion 400 to face each other, and the vibration plate 420 is not disposed directly under the weight portion 200. Accordingly, the vibration plate 420 is protected from abnormal driving of the weight portion 200. Preferably, the flat surface 310 of the enclosure portion 300 extends to be longer than a length of the piezoelectric element 410 so as to cover the piezoelectric element 410 overall.

Selectively, the enclosure portion 300 facilitates coupling of respective components by using a two-sided tape 330 between a lower surface of the flat surface 310 and the upper surface of the vibration plate 420.

The piezoelectric vibration actuator 1' according to another exemplary embodiment of the present disclosure binds center portions of the weight portion 200 and the enclosure portion 300 and the vibration portion 400 by using the binding member 600 so that they are adhered to one another. As illustrated in FIG. 5, the binding member 600 is coupled to the center area of the weight portion 200 and the center area of the piezoelectric element 410 of the vibration portion 400 at circumferences thereof by using a banding member such as a tape or a ring-shaped band. In order that the binding member 600 encloses the lower surface of the piezoelectric element 410, the leg portion 320 of the enclosure portion 300 is formed at two edges of the flat surface 310 at two end portions except a center portion of the flat surface 310. Accordingly, the binding member 600 is disposed in the center area of the weight portion 200 and is wound between the leg portions 320 disposed symmetrically as illustrated in FIG. 6. Consequently, binding of the center area of the weight portion 200 and the center area of the vibration portion 400 is facilitated using the binding member 600.

The vibration plate 420 illustrated in FIG. 3 which is thin and long may be replaced by a vibration plate 420 formed of three components according to the present disclosure. Referring to FIG. 6, the vibration plate 420 may be formed of a pair of first plates 421 and a second plate 422, and the pair of first plates 421 may be spaced apart from each other, preferably, by a distance that is greater than a length of the piezoelectric element 410. Alternatively, a length of the second plate 422 may be greater than the length of the piezoelectric element 410. The piezoelectric element 410 is disposed on a lower surface of the second plate 422. The second plate 422 is disposed between the first plates 421 spaced apart from each other, and is connected to the pair of first plates 421 in various manners. Preferably, the pair of first plates 421 may be coupled to the lower surface of the second plate 422 at two ends of the second plate 422, and the piezoelectric element 410 is disposed in space defined by the lower surface of the second plate 422 and the pair of first plates 421.

Preferably, the pair of first plates 421 may be formed of a metal material that is subject to deformation of a piezoelectric element and elastic, such as a SUS. Also, the second plate 422 may be formed of an Invar material having a similar coefficient of thermal expansion as that of the piezoelectric element 410. However, the first and second plates 421 and 422 are not limited thereto, and may be formed of other various materials.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A piezoelectric vibration actuator comprising:
- a flat cover member;
- a vibration portion including a vibration plate that is spaced apart from the cover member in parallel by a predetermined distance and a piezoelectric element that generates a vibration force by repeatedly expanding and contracting according to power applied from the outside;
- a weight portion disposed on the vibration portion to increase the vibration force of the piezoelectric element; and
- a binding member fixing the vibration portion and the weight portion,
- wherein the vibration plate is formed of a pair of first plates spaced apart from each other and a second plate disposed between the pair of first plates.

2. The piezoelectric vibration actuator of claim 1, wherein the binding member is disposed along circumferences of center areas of the vibration portion and the weight portion.

3. The piezoelectric vibration actuator of claim 1, wherein a mounting portion is formed on each of two end portions of the cover member.

4. The piezoelectric vibration actuator of claim 1, wherein the piezoelectric element is disposed on a lower surface of the vibration plate.

5. The piezoelectric vibration actuator of claim 1, further comprising a case having one opened surface and forming inner space.

6. The piezoelectric vibration actuator of claim 5, wherein the one opened surface of the case is shielded using the cover member.

7. The piezoelectric vibration actuator of claim 1, wherein the pair of first plates are coupled to a lower surface of the second plate at two ends of the second plate.

8. The piezoelectric vibration actuator of claim 7, wherein the piezoelectric element is disposed on the lower surface of the second plate.

9. The piezoelectric vibration actuator of claim 1, wherein the second plate is extended to be longer than a length of the piezoelectric element.

10. The piezoelectric vibration actuator of claim 1, wherein a concave portion is formed in an outer circumferential surface of a center area of the weight, portion.

11. The piezoelectric vibration actuator of claim 5, wherein a block is formed on each of inner surfaces of the case facing each other.

12. The piezoelectric vibration actuator of claim 5, wherein an upper inner surface of the case and an upper surface of the cover member further include an impact buffer member.

13. The piezoelectric vibration actuator of claim 1, further comprising an enclosure portion between the weight portion and the vibration portion.

14. The piezoelectric vibration actuator of claim 13, wherein the enclosure portion is formed of a flat surface and a leg portion that extends vertically downward from two edges of the flat surface.

15. The piezoelectric vibration actuator of claim 14, wherein the leg portion is disposed to be adjacent to two end portions of the flat surface in, a length direction.

16. The piezoelectric vibration actuator of claim 14, wherein the flat surface is extended to be longer than a length of the piezoelectric element.

* * * * *